United States Patent [19]
Villa et al.

[11] Patent Number: 5,595,921
[45] Date of Patent: Jan. 21, 1997

[54] METHOD FOR FABRICATING A FULLY DEPLETED LATERAL TRANSISTOR

[75] Inventors: Flavio Villa, Milan; Enrico M. A. Ravanelli, Monza, both of Italy

[73] Assignee: SGS-Thomson Microelectronics, S.r.l., Agrate Brianza, Italy

[21] Appl. No.: 459,052

[22] Filed: Jun. 2, 1995

Related U.S. Application Data

[62] Division of Ser. No. 200,396, Feb. 23, 1994.

[30] Foreign Application Priority Data

Feb. 24, 1993 [EP] European Pat. Off. ............. 93830073

[51] Int. Cl.$^6$ ............................................. H01L 21/8234
[52] U.S. Cl. .................... 437/40; 437/26; 437/41; 148/DIG. 126
[58] Field of Search ............... 437/40 AS, 41 AS, 437/40 DM, 41 DM, 913, 26, 30; 148/DIG. 126

[56] References Cited

U.S. PATENT DOCUMENTS

| | | | |
|---|---|---|---|
| 4,300,150 | 11/1981 | Colak | 257/409 |
| 4,628,341 | 12/1986 | Thomas | 257/339 |
| 4,914,051 | 4/1990 | Huie et al. | 437/40 DM |
| 4,989,058 | 1/1991 | Colak et al. | 257/493 |
| 5,132,235 | 7/1992 | Williams et al. | 437/26 |
| 5,306,656 | 4/1994 | Williams et al. | 437/40 AS |

FOREIGN PATENT DOCUMENTS

| | | |
|---|---|---|
| 0500233A2 | 8/1992 | European Pat. Off. . |
| 0069429A3 | 1/1993 | European Pat. Off. . |

OTHER PUBLICATIONS

Appels, et al., "Thin Layer High–Voltage Devices", Philips J. Res., vol. 35, No. 1, 1980, pp. 1–13.

*Primary Examiner*—Charles L. Bowers, Jr.
*Assistant Examiner*—Michael Trinh
*Attorney, Agent, or Firm*—Robert Groover; Betty Formby

[57] ABSTRACT

The breakdown characteristics of a lateral transistor integrated in an epitaxial layer of a first type of conductivity grown on a substrate of an opposite type of conductivity and comprising a drain region formed in said epitaxial layer, are markedly improved without recurring to critical adjustments of physical parameters of the integrated structure by forming a buried region having the same type of conductivity of the substrate and a slightly higher level of doping at the interface between the epitaxial layer and the substrate in a zone laying beneath the drain region of the transistor.

7 Claims, 5 Drawing Sheets

$V_D < V_{PO}$ $V_D = V_{PO}$ $V_D > V_{PO}$

METHOD FOR FABRICATING A FULLY DEPLETED LATERAL TRANSISTOR

This is a divisional of application Ser. No. 08/200,396, filed Feb. 23, 1994, now allowed.

CROSS-REFERENCE TO RELATED APPLICATION

This application claims priority from European App'n 93830073.8, filed Feb. 24, 1993, which is hereby incorporated by reference.

BACKGROUND AND SUMMARY OF THE INVENTION

The present invention relates to a lateral, double-diffused transistor (e.g. an LDMOS) having improved breakdown characteristics, particularly suited for high voltage integrated circuits (HVICs).

Typically, high-voltage, integrated circuits (HVICs) contain one or more high-voltage power transistors together with a low voltage signal processing circuitry on the same chip. The use of this type of integrated circuits is becoming more and more widespread as a viable alternative to the use of a plurality of discrete circuits, in a wide variety of applications.

In these integrated circuits, lateral, double-diffused, MOS transistors (LDMOS) are widely used as active power devices.

One way to improve the voltage handling capability of a lateral transistor is a so-called RESURF technique. ("RESURF" is an acronym for REduced SURface Field.) This particular technique is described in an article of J. A. Appels et al. at 35 PHILIPS J. RES. 1–13 (1980), the content of which is herein incorporated by express reference. The physical structure of a RESURF LDMOS transistor, as depicted in FIGS. 1 and 2, is substantially identical to the structure of a conventional LDMOS transistor. The main difference between the two devices consists in the fact that the structure of a RESURF LDMOS is generally formed in a much thinner epitaxial layer than a conventional high voltage device. For this reason, the bottom-side depletion region pertaining to the junction between the epitaxial layer, for example of an n-conductivity, and a substrate layer, for example of a p-conductivity, has a significant effect on high-voltage withstanding capability in the case of a RESURF type LDMOS structure.

For better illustrating the breakdown mechanism in a RESURF LDMOS structure, FIGS. 3, 4 and 5 show in a qualitative and schematic way the progress of the depletion region into the drift region (the region where electric charge carriers move under the influence of an electric field).

The situations that develop in the drift region with an increase of the voltage applied to a drain terminal (D), in a grounded-source configured transistor, are schematically depicted in FIGS. 3, 4 and 5, wherein the depleted region is identified with crosshatching. The operating condition characterized by a relatively low voltage applied to the drain terminal of the device, i.e. a voltage lower than the "pinchoff" voltage ($V_d<V_{PO}$), is depicted in FIG. 3. As may be observed, in such a low drain voltage condition, practically no interaction exists between the surface depletion region that develops under a gate structure (G) and the bottom-side depletion region (or more briefly bottom depletion region) that develops across the junction between the substrate and the epitaxial layer. In these conditions, the electric fields pertaining to the superficial regions of the structure will have values similar to those that occur in a conventional type LDMOS structure (i.e. in a similar transistor structure formed in a relatively thicker epitaxial layer).

Upon an increase of the voltage applied to the drain (D) of the transistor, and when such a voltage reaches a "pinch-off" value (VD=VPO), the two depleted regions (surface and bottom regions) merge. This "pinch-off" condition is schematically depicted in FIG. 4. Because of an expansion of the depletion region in the drift region, the increase of the electric field intensity under the edge of the gate electrode tends to be less than in the case of a conventional LDMOS structure.

When the voltage applied to the drain (D) of the device rises above the pinch-off voltage (VD<VPO), the surface depletion region tends to extend laterally toward the drain region (the n+region in the case shown in the Figures), and eventually the whole drift region becomes completely depleted. This may occur as long as the electric field that develops under the edge of the gate electrode during such a lateral extension of the surface depletion region remains lower than the critical electric field (at which avalanche breakdown may occur). Under these conditions, as schematically shown in FIG. 5, the drift region under the edge of the gate electrode becomes practically isolated from the drain region and therefore the local electric field intensity remains approximately constant even if the drain voltage is increased further.

Thus, under these conditions in a grounded source configuration, the breakdown mechanism of the device is determined solely by the presence of intense electric fields near the drain diffusion (n+) or at the junction between the substrate and the epitaxial layer. However, in general the main objectives in designing a power transistor are: 1) reducing its internal resistance (ON-resistance) and 2) achieving the highest possible breakdown voltage.

These two objectives could be reached if the drift region was completely depleted just before electric fields of critical intensity would develop under the edge of the gate electrode. This would ensure that the device be in a working condition as the one depicted in FIG. 5; a condition that determines the best avalanche breakdown voltage that can be obtained for a certain charge density in the drift region. In other words, an optimal RESURF structure should operate under conditions of substantially complete depletion when the voltage that is applied to a drain terminal reaches or slightly rises above the pinch-off voltage (VD=VPO).

According to the known art, these objectives may be achieved or approached by accurately trimming common design parameters, such as for example the doping level of the epitaxial layer, the doping level of the substrate layer, the thickness of the field oxide and in particular the thickness and resistivity of the epitaxial layer. Optimization of the structure thus becomes a very critical process because while from one side a complete depletion region of the drift region must be favored, on the other side, the structure should retain the ability to withstand voltage breakdown between, for example, the source region p+ and the substrate p-, under punch-through conditions.

In contrast to the limitations of this state of the art, the disclosed innovations provide a way to optimize an integrated structure of a RESURF transistor in a noncritical way. This is accomplished by providing an additional degree of freedom in designing the structure, and thereby permitting achievement of a complete depletion of the drift region, irrespective of breakdown withstanding considerations pertaining to a punch-through mechanism between a source region and the substrate of the integrated structure. (Source-substrate breakdown conditions are particularly likely to occur when the transistor is functioning in a source follower configuration.)

Depletion width at a junction, for a given applied voltage, is related to the volume integral (over the volume within the depletion boundaries) of ionized dopant atoms; and therefore, by increasing the net concentration of dopant atoms below the metallurgical boundary, the lower depletion width is decreased and the upper depletion width is increased.

According to disclosed innovative embodiments, this is obtained by forming a buried region having a doping level higher than the doping level of the substrate, between the substrate and the epitaxial layer and projectively underneath the drain region. This buried region is kept at a sufficiently large distance from a source region so that a punch-through between the source region and the buried region (because of the curvature effect that the buried region may induce, though in an extremely limited fashion) does not become a limiting parameter in the functioning of the device at the design voltages.

This buried region may be formed by ion implanting the substrate, within a defined area, before going through the normal steps of a standard fabrication process of these devices that bring about the formation of buried layers in general and the growth of the epitaxial layer.

This buried region extends for a major part of its "thickness" into the substrate. Preferably there is no ohmic contact path between the buried region and any other regions or conducting layers.

In practice, this buried region permits the device designer to "modulate" the depletion along the junction between the epitaxial layer and the substrate in an important zone (underlying the drain region of the device) differently from other zones, and in particular from the zone underlying the source region of the structure. In this way, a complete depletion of the drift region at the drain end, from the horizontal junction up to the surface, is favored without necessarily modifying the values of other physical parameters of the integrated structure, such as for example without further decreasing the thickness of the epitaxial layer, or increasing the doping level of the epitaxial layer, both of which would be detrimental in terms of punchthrough.

According to a disclosed class of innovative embodiments, there is provided: A transistor, for operation at a known maximum operating source/drain voltage, comprising: a substrate which includes at least one substantially monolithic body of semiconductor material of a first conductivity type; a semiconductor epitaxial layer of a second conductivity type atop said substantially monolithic body; a lateral transistor, at a surface of said epitaxial layer, comprising source, gate, and drain regions with said gate region being laterally interposed between said source and drain regions to control current flow therebetween; and a first portion of a patterned buried layer, at the boundary between said substrate and said epitaxial layer, in locations such that said drain, but NOT said source, lies thereabove; wherein said epitaxial layer has a thickness and doping such as to be fully depleted, in locations between said source and drain, when said predetermined maximum operating source/drain voltage is applied to said source and drain.

According to another disclosed class of innovative embodiments, there is provided: A transistor, comprising: a substrate which includes at least one substantially monolithic body of semiconductor material of a first conductivity type; a semiconductor epitaxial layer of a second conductivity type atop said substantially monolithic body; a lateral transistor, at a surface of said epitaxial layer, comprising source, gate, and drain regions with said gate region being laterally interposed between said source and drain regions to control current flow therebetween; and a first portion of a patterned buried layer, at the boundary between said substrate and said epitaxial layer, in locations such that said drain, but NOT said source, lies thereabove; wherein no ohmic connection to said buried layer exists except through said substrate.

According to another disclosed class of innovative embodiments, there is provided: A transistor, for operation at a known maximum operating source/drain voltage, comprising: a substrate which includes at least one substantially monolithic body of semiconductor material of a first conductivity type; a semiconductor epitaxial layer of a second conductivity type atop said substantially monolithic body; a lateral transistor, at a surface of said epitaxial layer, comprising source, gate, and drain regions with said gate region being laterally interposed between said source and drain regions to control current flow therebetween; and a first portion of a patterned buried layer, at the boundary between said substrate and said epitaxial layer, in locations such that said drain, but NOT said source, lies thereabove; wherein said epitaxial layer has a thickness and doping such as to be fully depleted, in locations between said source and drain, when said predetermined maximum operating source/drain voltage is applied to said source and drain; and wherein said buried layer laterally surrounds said drain on all sides thereof.

According to another disclosed class of innovative embodiments, there is provided: A transistor, comprising: a substrate which includes at least one substantially monolithic body of semiconductor material of a first conductivity type; a semiconductor epitaxial layer of a second conductivity type atop said substantially monolithic body; a lateral transistor, at a surface of said epitaxial layer, comprising source, gate, and drain regions with said gate region being laterally interposed between said source and drain regions to control current flow therebetween; and a first portion of a patterned buried layer, at the boundary between said substrate and said epitaxial layer, in locations such that said drain, but NOT said source, lies thereabove; wherein said source and drain regions define a first lateral separation therebetween, and said source region and said buried layer define a second lateral separation therebetween which is more than 30% and less than 100% of said first lateral separation.

According to another disclosed class of innovative embodiments, there is provided: A transistor, for operation at a known maximum operating source/drain voltage, comprising: a substrate which includes at least one substantially monolithic body of semiconductor material of a first conductivity type; a semiconductor epitaxial layer of a second conductivity type atop said substantially monolithic body; a lateral transistor, at a surface of said epitaxial layer, comprising source, gate, and drain regions with said gate region being laterally interposed between said source and drain regions to control current flow therebetween; and a first portion of a patterned buried layer, at the boundary between said substrate and said epitaxial layer, in locations such that said drain, but NOT said source, lies thereabove; wherein said epitaxial layer has a thickness and doping such as to be fully depleted, in locations between said source and drain, when said predetermined maximum operating source/drain voltage is applied to said source and drain.

According to another disclosed class of innovative embodiments, there is provided: An integrated circuit, comprising: a substrate which includes at least one substantially monolithic body of semiconductor material of a first conductivity type; a semiconductor epitaxial layer of a second conductivity type atop said substantially monolithic body; a lateral high-voltage transistor, at a surface of said epitaxial layer, comprising source, gate, and drain regions with said gate region being laterally interposed between said source and drain regions to control current flow therebetween; a first portion of a patterned buried layer, at the boundary between said substrate and said epitaxial layer, in locations such that said drain, but NOT said source, lies thereabove; and a plurality of low-voltage transistors integrated in said epitaxial layer; wherein at least some ones of said low-voltage transistors overlie other portions of said patterned buried layer.

According to another disclosed class of innovative embodiments, there is provided: An integrated circuit, comprising: a substrate which includes at least one substantially monolithic body of semiconductor material of a first conductivity type; a semiconductor epitaxial layer of a second conductivity type atop said substantially monolithic body; a lateral high-voltage transistor, at a surface of said epitaxial layer, comprising source, gate, and drain regions with said gate region being laterally interposed between said source and drain regions to control current flow therebetween; a first portion of a patterned buried layer, at the boundary between said substrate and said epitaxial layer, in locations such that said drain, but NOT said source, lies thereabove; and a plurality of low-voltage transistors formed in said epitaxial layer; wherein said low-voltage transistors include at least some P-channel field-effect transistors which are formed over additional portions of said patterned buried layer, and wherein said low-voltage transistors include at least some PNP transistors which are formed over further portions of said patterned buried layer.

According to another disclosed class of innovative embodiments, there is provided: A lateral transistor integrated in an epitaxial layer of a first type of conductivity grown on a semiconducting substrate having a second type of conductivity, comprising: a drain region in said epitaxial layer; a buried region having the same type of conductivity of said substrate and a doping level higher than said semiconducting substrate, between said substrate and said epitaxial layer in a zone lying beneath said drain region of the transistor.

According to another disclosed class of innovative embodiments, there is provided: A fabrication method, comprising the steps of: (a.) providing a substrate which includes at least one substantially monolithic body of semiconductor material of a first conductivity type; (b.) performing a patterned implantation step, to introduce additional dopants of said first conductivity type into said substrate; (c.) growing an epitaxial semiconductor layer of a second conductivity type atop said substrate; (d.) forming source, gate, and drain regions at a surface of said epitaxial layer, with said gate region being laterally interposed between said source and drain regions to control current flow therebetween, in locations such that said drain, but NOT said source, lies above said additional dopants introduced in said step (b).

According to another disclosed class of innovative embodiments, there is provided: A method for improving the breakdown characteristics of a lateral transistor integrated in an epitaxial layer of a first type of conductivity grown on a semiconducting substrate of a second type of conductivity and comprising a drain region formed in said epitaxial layer which is contacted through a drain contact, characterized by forming a buried region having the same type of conductivity of the substrate and a doping level higher than the doping level of the substrate, between the substrate and said epitaxial layer in a zone beneath the drain region of the transistor.

According to another disclosed class of innovative embodiments, there is provided: A method for favoring depletion of a drift region comprised between a source region and a drain region of a lateral transistor, integrated in an epitaxial layer of a first type of conductivity grown on a semiconducting substrate of a second type of conductivity, comprising forming a buried region having the same type of conductivity of said substrate and a doping level higher than the doping level of the substrate, between the substrate and said epitaxial layer, in a zone beneath said drain region of the transistor.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION

Figure 1:
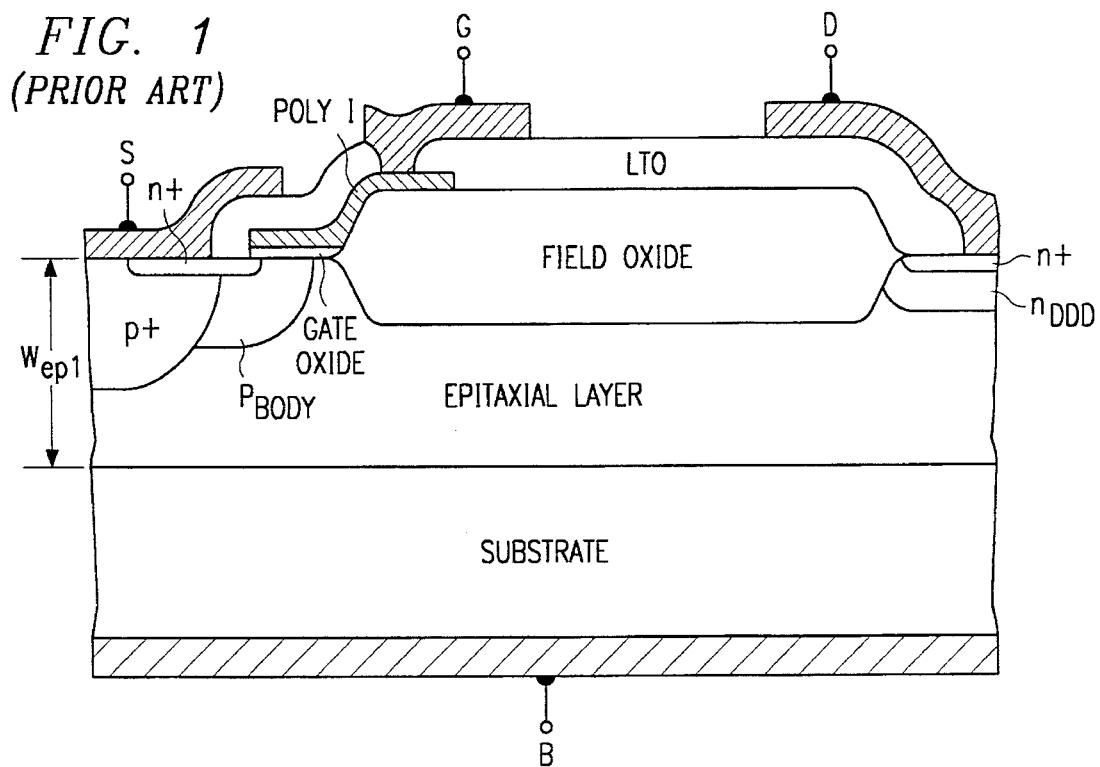
FIG. 1 is a schematic partial cross section of an integrated LDMOS structure of a known type.
Figure 2:
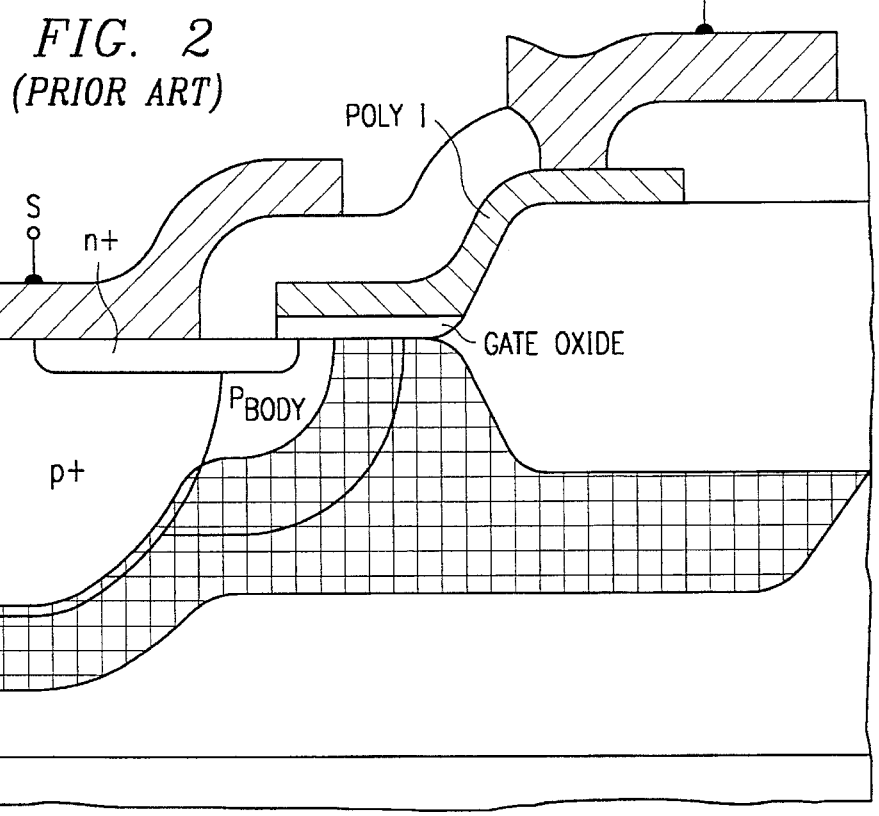
FIG. 2 is an enlarged view of the channel region of the LDMOS structure.
Figure 3:
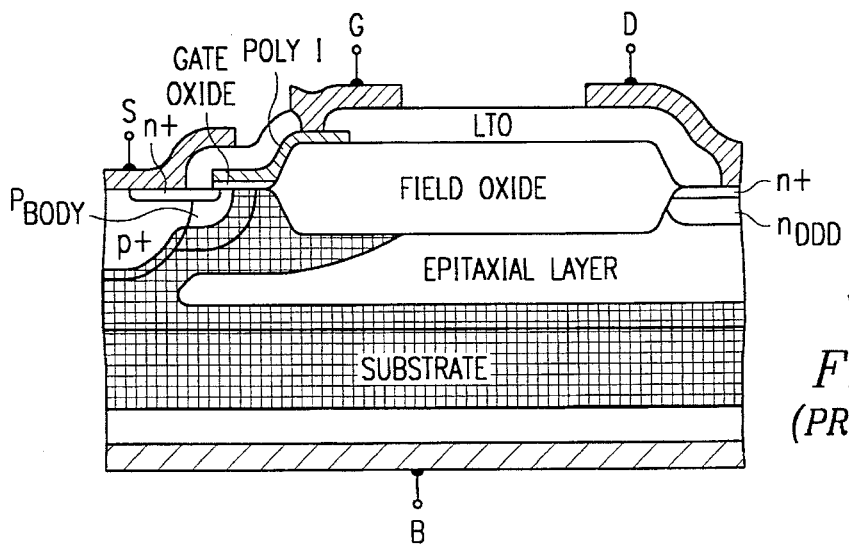
FIGS. 3, 4 and 5, as described above, show in a schematic way the development of a depletion zone in the drift region between a source region and a drain region of the integrated LDMOS structure, with the rising of the voltage applied to the drain.
Figure 4:
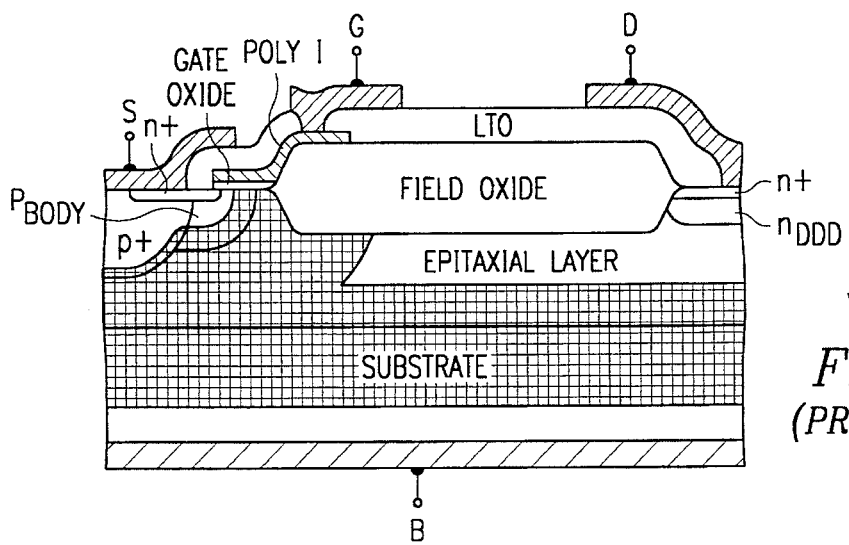
Figure 5:
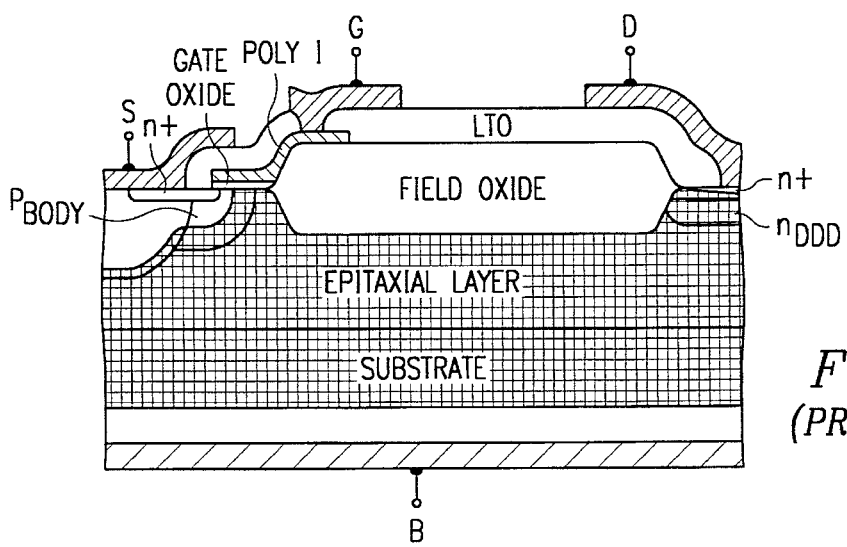
Figure 6:
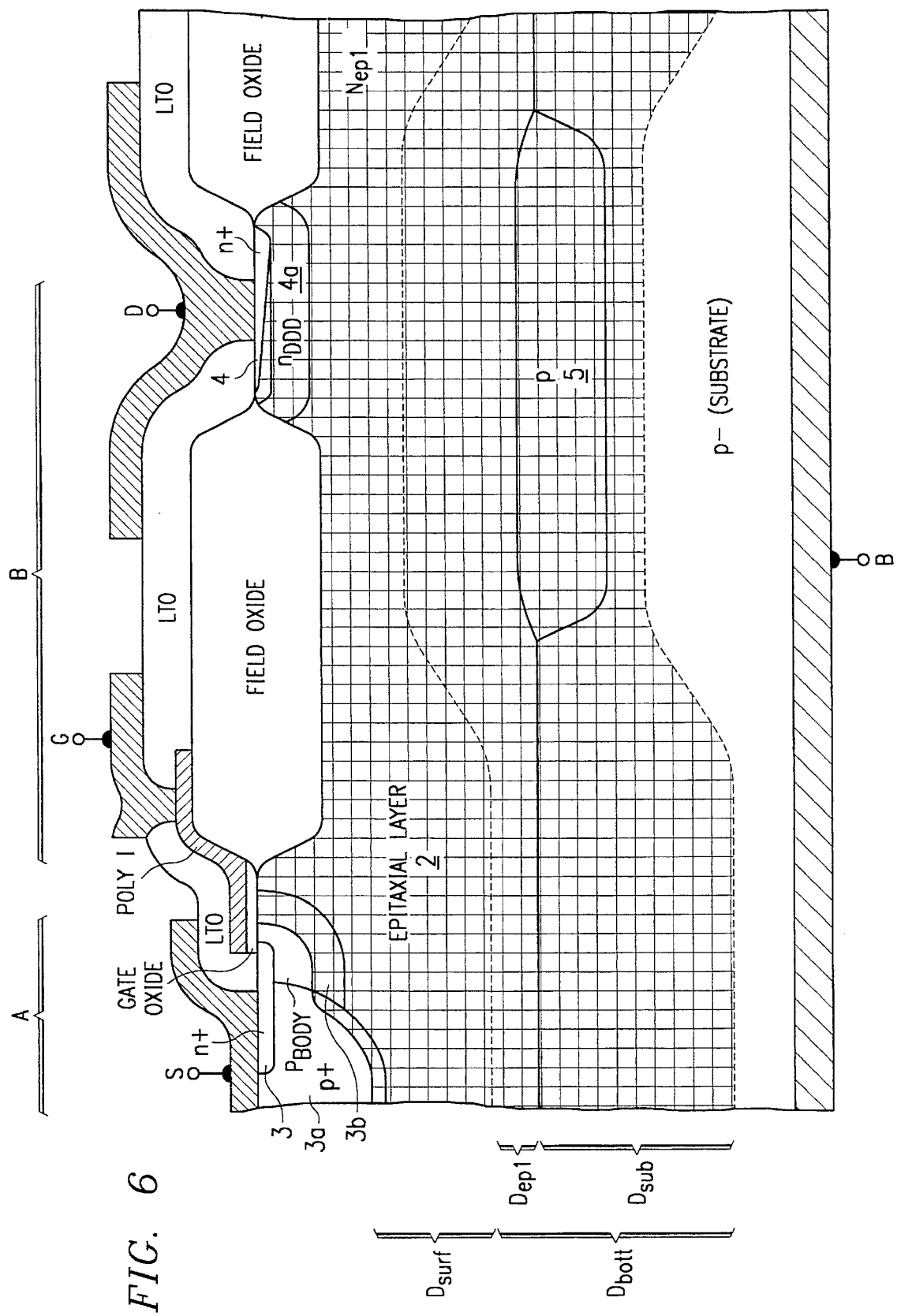
FIG. 6 is a partial schematic cross section view of an integrated LDMOS structure made in accordance with the present invention.

The numerous innovative teachings of the present application will now be described with particular reference to the presently preferred embodiment, by way of illustration and not by way of limitation. With reference to FIG. 6, an LDMOS structure made in accordance with the present invention is characterized by the presence of a buried region 5 which extends for a major portion thereof into the substrate 1, in a zone laying under the drain region of the device that is represented by the n+ region 4 and by the $n_{DDD}$ region 4a. ("DDD" is an acronym for Double Diffused Drain.)

The buried region 5 has a conductivity of the same type of the substrate 1 and a concentration of dopant that is slightly greater than the dopant concentration of the substrate. For example, in a typical case of a p- substrate having a bulk resistivity comprised between 100 and 150 Ω-cm, the buried region 5 may be realized by implementing the substrate with Boron at 80 KeV for a dose of $6 \cdot 10^{11}$ atoms (boron)/cm².

Generally, the buried region 5 may be formed by implanting the surface of the substrate 1 with atoms of the desired dopant, within the areas defined by a mask, before proceeding to the growth of the epitaxial layer 2. The diffusion profile of the region 5 so created is such as to extend into the growing epitaxial layer 2 above the substrate 1 in a relatively lesser extent than into the substrate 1 itself. In practice, diffusion of the implanted dopant is considerably more pronounced in the substrate 1 than in the growing epitaxial layer 2. This fact determines a nontrivial and advantageous effect in minimizing the curvature of the junction that is created between the buried region 5 and the epitaxial layer. Therefore, the creation of the buried region 5 according to the present invention does not negatively effect the breakdown characteristics of the resulting structure because of the introduction of substantially negligible curvature effects.

On the other hand, the presence of a buried region 5, has the remarkable effect of causing a shift of the bottom depletion region $D_{bot}$, (identified in FIG. 6 by the cross-hatched area), that is of the depletion region pertaining to the junction n-epi/p-substrate. The bottom depletion region is shifted toward the epitaxial layer side of the junction. In this way the "thickness" of the depletion region in the epitaxial layer (Depi) is virtually increased, in correspondence of the location of the buried region 5, while the "thickness" of the depletion region in the substrate (Dsub) is proportionally decreased.

As a consequence of this local "lifting" of the bottom depletion region toward an overlaying drain region 4 (n+), a complete depletion of any residual, not yet depleted, drain-end portion of the drift region between the source region and the drain region of the device is greatly enhanced. This may occur when the voltage applied to the drain D of the transistor reaches the level of the pinch-off voltage ($V_D \geq V_{PO}$) in the drift region, that is when an interaction (merging) of the surface depletion region $D_{surf}$ and of the bottom depletion region $D_{bot}$ occurs.

The improved RESURF structure provided by the present invention has the intrinsic advantage of permitting that, in correspondence with the source region (which is indicated as a whole with reference A in the figure), the bottom depletion region $D_{bot}$ maintain a relatively pronounced extension for a consistent depth into the bulk of the substrate 1, so as to retain a high punch-through breakdown voltage. Conversely, in the drain region (which is indicated as a whole with reference B), the bottom depletion region $D_{bot}$ is, as a whole, shifted proportionally more into the epitaxial layer 2, so as to favor and produce a complete depletion of the drift region at its drain-end.

In this way, because the curvature effect created by the junction that is formed between the buried region 5 and the epitaxial layer is substantially negligible, the breakdown of the integrated structure, is determined solely by the following factors:
the electric field intensity near the drain region, in a grounded-source configuration; and
the punch-through voltage between the source region 3a (p+) and the substrate 1, in a source-follower configuration.

It is evident that the novel RESURF structure is much less critical from the point of view of possible breakdown mechanisms as compared with a conventional structure, without a buried region 5 that characterize the structure of the present invention.

Moreover, it has been found that the buried region 5 reduces also the probability of the occurrence of a so-called premature breakdown due to three-dimensional effects at the source/drain terminations of the fingers of an interdigitated integrated structure typical of power devices, besides substantially eliminating all instabilities of the breakdown voltage pertaining to intense surface fields.

Figure 7:
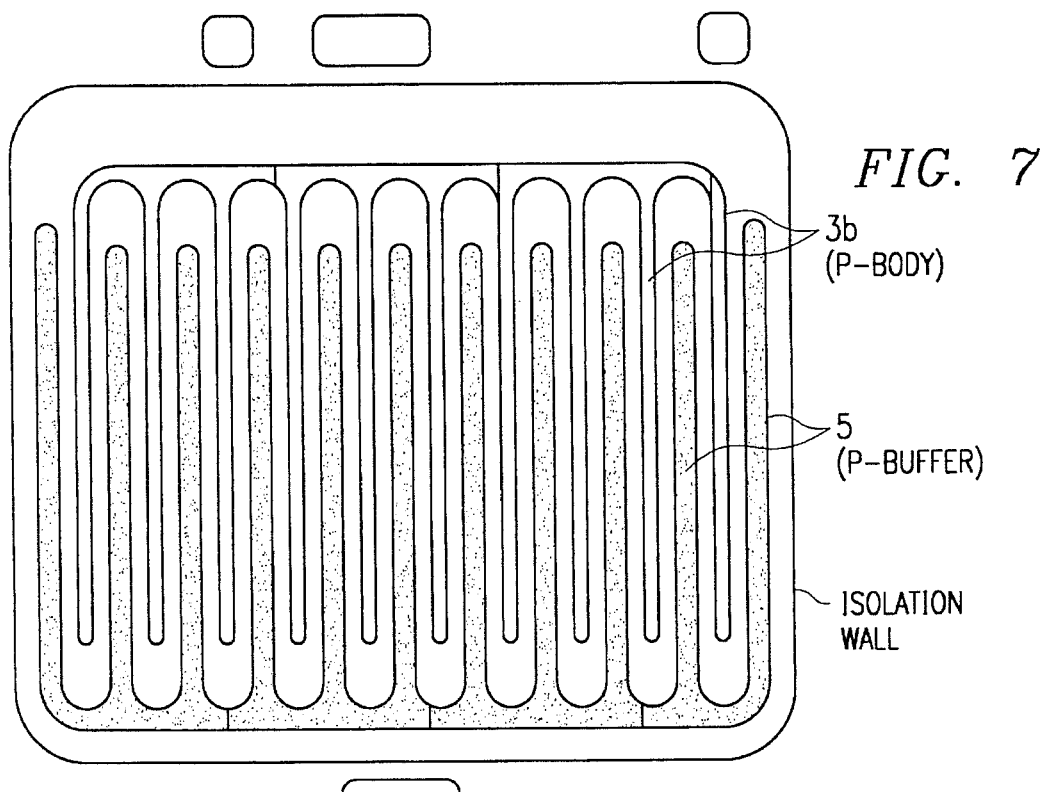
FIGS. 7 and 8, are layout views of a RESURF LDMOS transistor made in accordance with the present invention.

The arrangement of the buried region 5 underneath the drain regions in a typical interdigitated layout of a power LDMOS transistor is depicted in the simplified layout of a ten-finger transistor shown in FIG. 7.

The buried region 5 may also be extended along the entire perimeter of the integrated LDMOS transistor structure, by extending it radially as far as the internal "wall" of an isolation diffusion that completely surrounds the area occupied by the integrated transistor structure and which extend throughout the entire thickness of the epitaxial layer, according to known techniques. This alternative embodiment is schematically shown in the simplified layout view of FIG. 8.

According to a typical embodiment of the invention, the different regions that characterize an integrated RESURF LDMOS structure made in accordance with the present invention may be fabricated with device characteristics as follows:

| REGION | RESISTIVITY AND IMPLANT PARAMETERS | THICKNESS OR DEPTHS OF JUNCTION |
|---|---|---|
| p substrate 1 | 100–150 Ω-cm | 375 μm |
| n epi layer 2 | 6 Ω-cm | 18 μm |
| gate oxide | — | 850 Å |
| field oxide | — | 1.1 μm |
| p+ contact 3a | $1 \cdot 10^{15}$ cm$^{-2}$B/80 KeV | 3.8 μm |
| p-body 3b | $5 \cdot 10^{13}$ cm$^{-2}$B/70 KeV | 3.0 μm |
| n+ source 3 | $5 \cdot 10^{15}$ cm$^{-2}$As/50 KeV | 0.5 μm |
| n+ drain 4 | $5 \cdot 10^{15}$ cm$^{-2}$As/50 KeV | 0.5 μm |
| $n_{DDD}$ region 4a | $8 \cdot 10^{13}$ cm$^{-2}$As/50 KeV | 1.2 μm |
| buried region 5 | $6 \cdot 10^{11}$ cm$^{-2}$B/80 KeV | 5 μm* |

*(in substrate)

With the device parameters given above, for a specified breakdown voltage of 650 V, sample lateral dimensions are, for example:
60 μm lateral separation between source and drain:
45–60 μm lateral separation between source and new buried layer (depending on process variation).
These dimensions, of course, are merely illustrative, and can be appropriately varied.

In the preferred embodiment, as noted above, the buried layer is almost entirely below the epi/substrate boundary. The degree of updiffusion is controlled by the implant dose, and by the furnace cycle used to form the Sb-doped buried layer for the bipolar portion of a mixed technology process.

The buried layer is preferably not be allowed to extend up into the epitaxial layer to a larger extent than that shown, to prevent premature breakdown to curvature effect. (That is, as is well known, electric field magnitude and electric-field-dependent effects will be increased at locations where a junction is highly convex.)

The epitaxial layer doping and thickness determine the breakdown voltage for a particular device, and the on-state resistance $R_{ON}$ is adjusted by varying the area of the device.

Figure 8:
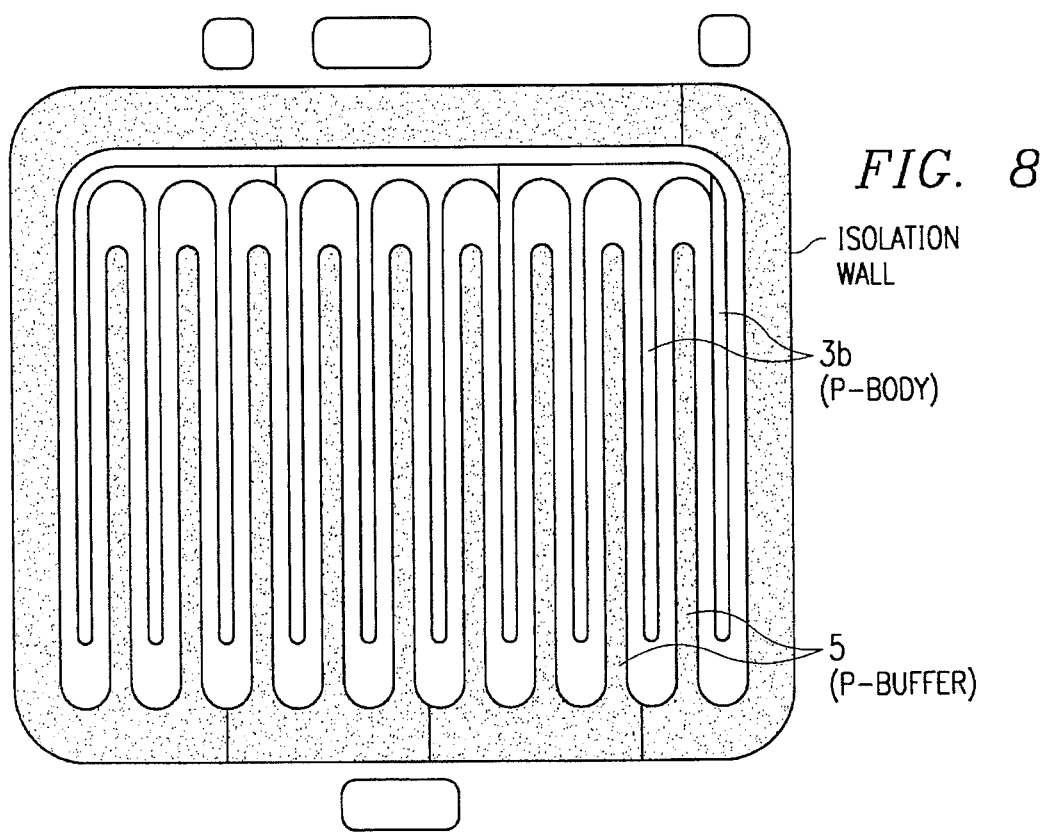
Figure 9:
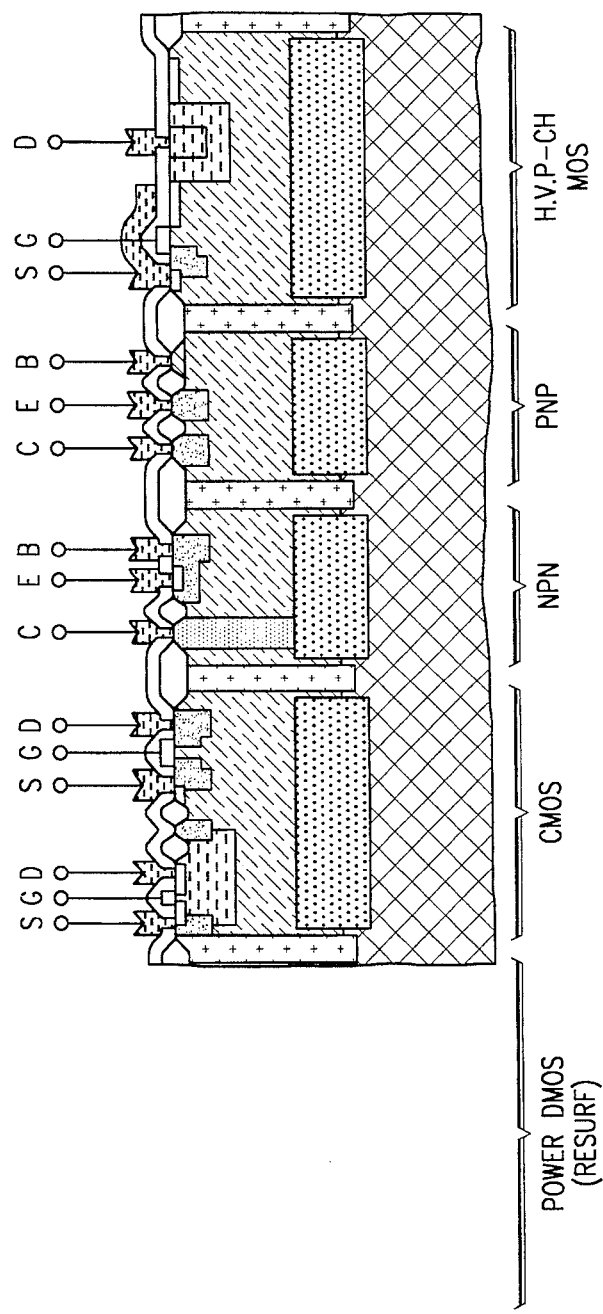
FIG. 9 shows a portion of other device structures which can be combined, in a single HVIC device, with a high-voltage transistor as disclosed in FIGS. 6, 7, or 8.

FIG. 9 shows a portion of other device structures which can be combined, in a single HVIC or smart-power device, with a high-voltage transistor as disclosed in FIGS. 6, 7, or 8. This particular example includes NMOS and PMOS devices, NPN and PNP bipolar devices, and high-voltage PMOS devices, as well as the high-voltage power transistor of e.g. FIGS. 6–8. However, of course, other integrated processes may include less than all of these and/or may include additional device types. The embodiment shown uses junction isolation between adjacent device domains, but of course trench isolation, or other isolation technologies, can be used instead.

Figure 10:
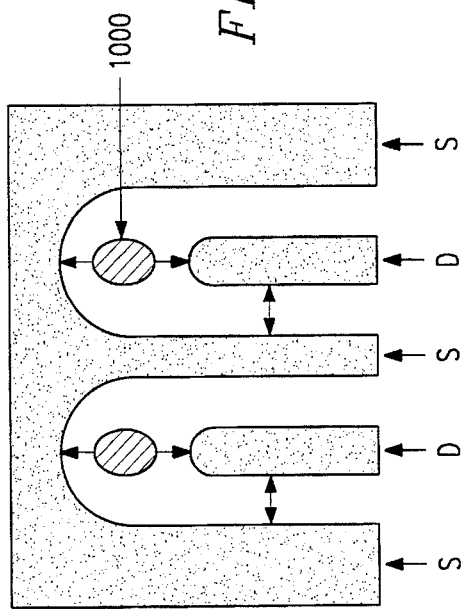
FIG. 10 shows how an undepleted zone may occur, in prior art structures, at finger terminations between source and drain.

The disclosed inventions are also generally useful in avoiding three-dimensional effects at the drain finger termination. (This is NOT specific to the embodiment of FIG. 8.) As shown in FIG. 10, it is normally necessary to increase the distance between source and drain at drain finger terminations, because of three-dimensional curvature effects. It may therefore happen that an undepleted zone 1000 is found, at such terminations, beyond the end of the drain finger. However, the alternative embodiments of FIGS. 7 and 8 advantageously avoid this, due to enhanced depletion beneath the drain.

Electrical connection of the integrated high voltage structure with the external world may be arranged by employing specially devised techniques for this type of power devices. In particular, it is possible to employ a segmented capacitance-chain technique for source connection and a simple capacitance-chain for drain connection, as disclosed in a prior European patent application of the same Applicant, No. 92830190.2, filed on Apr. 17, 1992, which is hereby incorporated by reference. The pertinent description contained in the above-identified prior patent application is incorporated herein by express reference. A combination of the beneficial effects, as produced by the structure of the present invention, with the beneficial effects that may be obtained by arranging the electrical connections of the integrated transistor according to the teachings disclosed in said prior patent application, will permit to integrate power transistors capable of withstanding extremely high voltages.

Thus, the disclosed innovations enable reliable and economical manufacture of HVICs which can switch full-wave-rectified voltages from a 240 V power-line with a good margin of safety.

As will be readily recognized by those of ordinary skill in the art, the disclosed innovative device structures can be widely modified and varied. For example, the innovative device structures have been described with particular relevance to integrated power devices, but of course some of the disclosed innovations can also be applied to discrete power devices also.

Of course, the specific layer compositions and thicknesses given are merely illustrative, and do not by any means delimit the scope of the claimed inventions.

Of course, the disclosed structures can be adapted to higher (or lower) voltages, with appropriate dimensional scaling and/or process modification (as will be apparent to those of ordinary skill in the art).

It will be readily recognized that the described process steps can also be embedded into a wide variety of hybrid process flows, which combine various logic or lower-voltage devices with the innovative high-voltage device described.

The disclosed innovative structure can also be used with highvoltage lateral field-effect transistor structures other than the double-diffused structure of the presently preferred embodiment.

It is also possible to adapt the innovative structure for use with high-voltage lateral device structures other than the insulated-gate field-effect transistor structure of the presently preferred embodiment. For example, the disclosed innovations can also be adapted to, e.g., P-channels or to bipolar devices.

Of course, a wide variety of other device structures and/or device fabrication techniques, such as partial dielectric isolation, can also be introduced.

Also, the disclosed innovations can apply equally well to a multi-epitaxial structure, as long as the disclosed innovative depletion relations are maintained.

What is claimed is:

1. Method for fabricating a transistor, comprising the steps of:

(a) providing a substrate which includes at least one substantially monolithic body of semiconductor material of a first conductivity type;

(b) performing a patterned implantation step, to introduce additional dopants of said first conductivity type into said substrate;

(c) growing an epitaxial semiconductor layer of a second opposite conductivity type atop said substrate;

(d) forming source, gate, and drain regions at a surface of said epitaxial layer, with said gate region being laterally interposed between said source and drain regions to control current flow therebetween, in locations such that said drain region, but NOT said source region, lies above said additional dopants introduced in said step (b).

2. The method of claim 1, wherein said source and drain regions are formed with a first lateral separation therebetween, and said source region is formed with a minimum separation from dopants introduced in said step (b) which is more than 30% and less than 100% of said first lateral separation.

3. The method of claim 1, wherein said drain region is formed to be totally laterally surrounded by locations where dopants were introduced in said step (b).

4. The method of claim 1, wherein said step (b) introduces dopants into multiple separate locations.

5. The method of claim 1, wherein said first conductivity type is P-type.

6. The method of claim 1, wherein said substantially monolithic body extends through essentially all of said substrate.

7. The method of claim 1, wherein said growing step (c) forms multiple epitaxial layers.

\* \* \* \* \*